(12) United States Patent
Lubicki et al.

(10) Patent No.: US 10,468,876 B2
(45) Date of Patent: Nov. 5, 2019

(54) FAULT CURRENT LIMITER PROVIDING SYMMETRICAL ELECTROSTATIC SHIELDING

(71) Applicant: Varian Semiconductor Equipment Associates, Inc., Gloucester, MA (US)

(72) Inventors: Piotr Lubicki, Peabody, MA (US); Saeed Jazebi, Peabody, MA (US); David Morrell, Wakefield, MA (US); George Emmanuel, Peabody, MA (US); Paul Murphy, Reading, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 305 days.

(21) Appl. No.: 15/495,149

(22) Filed: Apr. 24, 2017

(65) Prior Publication Data
US 2018/0309288 A1 Oct. 25, 2018

(51) Int. Cl.
| | |
|---|---|
| *H02H 9/04* | (2006.01) |
| *H02H 1/00* | (2006.01) |
| *H01F 41/04* | (2006.01) |
| *H01F 6/02* | (2006.01) |
| *H02H 9/02* | (2006.01) |
| *H01F 6/06* | (2006.01) |
| *H01L 39/16* | (2006.01) |

(52) U.S. Cl.
CPC .......... *H02H 9/044* (2013.01); *H01F 41/048* (2013.01); *H02H 1/0007* (2013.01); *H01F 6/02* (2013.01); *H01F 6/06* (2013.01); *H01L 39/16* (2013.01); *H02H 9/023* (2013.01); *Y02E 40/69* (2013.01); *Y10T 29/49014* (2015.01)

(58) Field of Classification Search
USPC .......................................................... 361/19
See application file for complete search history.

(56) References Cited

U.S. PATENT DOCUMENTS

| | | | | |
|---|---|---|---|---|
| 5,617,280 | A * | 4/1997 | Hara | H01F 6/06 361/19 |
| 2005/0068701 | A1 | 3/2005 | Lee et al. | |
| 2006/0274458 | A1 * | 12/2006 | Tekletsadik | H01L 39/20 361/19 |
| 2007/0023680 | A1 | 2/2007 | Tekletsadik | |
| 2009/0156409 | A1 | 6/2009 | Hazelton et al. | |

(Continued)

OTHER PUBLICATIONS

International Search Report and Written Opinion dated Jul. 10, 2018 for PCT/US2018/023796 filed Mar. 22, 2018.

*Primary Examiner* — Danny Nguyen

(57) ABSTRACT

Embodiments of the disclosure include a fault current limiter (FCL) providing symmetrical electrostatic shielding. In some embodiments, a FCL includes a superconductor maintained at a first voltage greater than zero voltage, and an enclosure containing the superconductor, the enclosure maintained at a second voltage greater than zero voltage, wherein the second voltage is different from the first voltage. The FCL may include an electrical connection directly coupling the superconductor and the enclosure, wherein the electrical connection enables each of a plurality of current limiting modules of the superconductor to receive, during a fault condition, an equal or unequal sub-portion of a total voltage drop.

18 Claims, 7 Drawing Sheets

(56) References Cited

U.S. PATENT DOCUMENTS

2010/0254048 A1  10/2010  Darmann
2012/0035058 A1* 2/2012  Blakes ..................... H01F 6/02
                                                    505/163
2013/0201588 A1  8/2013  Tekletsadik et al.

* cited by examiner

FAULT CURRENT LIMITER PROVIDING SYMMETRICAL ELECTROSTATIC SHIELDING

FIELD

This disclosure relates to fault current limiters, and more particularly to a fault current limiter system providing symmetrical electrostatic shielding.

BACKGROUND

In electric power transmission and distribution networks, fault current conditions may occur. A fault current condition is an abrupt surge in the current flowing through the network caused by faults or short circuits in the network. Causes of the faults may include lightning striking the network, and downing and grounding of the transmission power lines due to severe weather or falling trees. When faults occur, a large load appears instantaneously. This surge or fault current condition is undesirable as the condition may damage the network or equipment connected to the network. In particular, the network and the equipment connected thereto may burn or, in some cases, explode. The network, in response, delivers a large amount of current (i.e. overcurrent) to this load or, in this case, the faults.

A fault current limiter (FCL) is a device for limiting fault currents, such as in a power system. Various types of FCLs have been developed over the years, including superconducting fault current limiters (SCFCLs), solid state fault current limiters, inductive fault current limiters, as well as other varieties known in the art. The FCL may be implemented in a system having generation, transmission, and distribution networks for providing power to various industrial, commercial, and/or residential electrical loads.

Generally, the SCFCL comprises a superconducting circuit exhibiting almost zero resistivity below a critical temperature level $T_C$, a critical magnetic field level $H_C$, and a critical current level $I_C$. If at least one of the conditions is raised above the critical level, the circuit becomes quenched and exhibits resistivity. During normal operation, the superconducting circuit of the SCFCL system is maintained below $T_C$, $H_C$, and $I_C$. During a fault, one or more the conditions is raised above the critical level $T_C$, $H_C$, and $I_C$. Instantaneously, the superconducting circuit in the SCFCL system is quenched and resistance surges, thus limiting transmission of the fault current. Following some time delay and after the short circuit fault is cleared, $T_o$, $H_o$ and $I_o$ are returned to normal values and current is transmitted through the network and the SCFCL system.

The SCFCL may comprise an enclosure electrically decoupled from ground, so the enclosure is electrically isolated from ground potential. In other embodiments, the enclosure may be grounded. The SCFCL may also have first and second terminals electrically connected to one or more current carrying lines. Maintaining the superconducting circuit at a low temperature within the enclosure using, for example, a coolant such as liquid nitrogen or another cryogenic gas may be desirable. Yet during a fault, voltage starts to build up across the superconducting circuit, creating gaseous bubbles (e.g., nitrogen) inside the enclosure. The bubbles weaken the dielectric strength of the coolant. Increasing a physical clearance between the superconducting circuit within the enclosure and the walls of the enclosure helps to increase the high voltage capability (dielectric strength) of the unit to overcome the deficiencies created by bubbles. Still, increasing the overall size of the enclosure is undesirable.

With respect to these and other considerations the present disclosure is provided.

BRIEF SUMMARY

A fault current limiter system according to an embodiment of the present disclosure includes a superconductor matrix within an enclosure, the superconductor matrix electrically connected to a set of terminals, and an electrical connection electrically connected between the matrix and the enclosure. The electrical connection permits a voltage across the superconductor matrix with respect to the enclosure to be less than a total voltage across the set of terminals.

A fault current limiter according to an embodiment of the present disclosure includes a superconductor maintained at a first voltage greater than zero voltage, and an enclosure containing the superconductor, the enclosure maintained at a second voltage greater than zero voltage, wherein the second voltage is different from the first voltage.

A method of providing symmetrical electrostatic shielding in a fault current limiter according to an embodiment of the present disclosure includes, maintaining a superconductor at a first voltage greater than zero voltage, and maintaining an enclosure at a second voltage greater than zero voltage. The second voltage is different from the first voltage, and the enclosure contains the superconductor.

BRIEF DESCRIPTION OF THE DRAWINGS

The accompanying drawings illustrate example approaches of the disclosure, including the practical application of the principles thereof, as follows.

Figure 1:
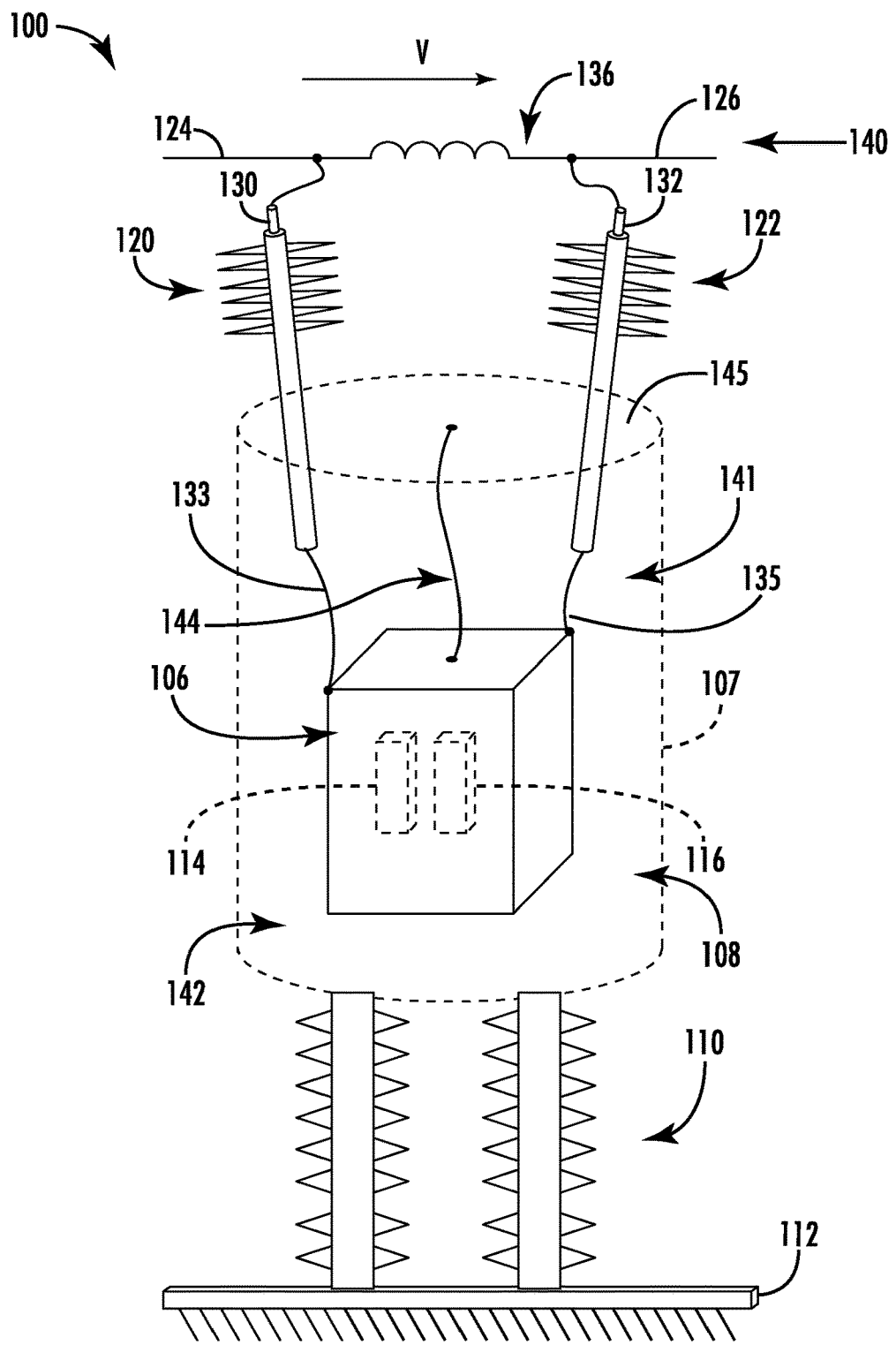
FIG. 1 depicts a perspective view of an example FCL system according to embodiments of the disclosure.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, various embodiments herein have been described in the context of one or more elements or components. An element or component may comprise any structure arranged to perform certain operations. Although an embodiment may be described with a limited number of elements in a certain topology by way of example, the embodiment may include more or less elements in alternate topologies as desired for a given implementation. Note any reference to "one embodiment" or "an embodiment" means a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

The present embodiments involve FCL systems providing symmetrical electrostatic shielding. In some embodiments, the FCL system includes a set of terminals in communication with a shunt reactor, and a superconducting matrix within an enclosure (e.g., a cryostat). The plurality of current limiting modules may be in communication with the set of terminals. The FCL further includes an electrical connection directly electrically connected to the enclosure, the electrical connection further connected between the plurality of current limiting modules. Arrangement of the electrical connection between the enclosure and superconducting matrix enables each of the plurality of current limiting modules to receive, during a fault condition, a sub-portion of a total voltage drop across the plurality of current limiting modules. In some embodiments, each current limiting module is a superconductor.

In some embodiments, the enclosure of the FCL system may be a cryostat of a superconducting fault current limiter connected to a phase voltage in order to reduce a clearance between the current limiting modules and the enclosure. This approach may be referred to as a live tank design. Clearances for lightning and switching impulses, for example, can be significantly reduced for live tanks using the approaches of the disclosure.

Embodiments of the present disclosure further address overvoltage conditions potentially occurring during the operation of a SCFCL. For example, during use, the superconductor may become resistive during a fault condition. As the result, voltage starts to build up across the current limiting elements. Simultaneously, heat generated in a tape of the SCFCL creates bubbles (e.g., gaseous nitrogen) inside the enclosure. The bubbles weaken the dielectric strength of the liquid nitrogen. Embodiments of the present disclosure advantageously avoid a voltage (e.g., a differential voltage) from asymmetrically building up on one of the terminals connected to the current limiting elements by providing proper clearance between the current limiting elements and the enclosure when this fault condition is present.

In some approaches, in order to optimize the clearances between current limiting elements and the enclosure wall in a geometrically symmetric design, a middle element in the form of an electrically conductive conduit or wire can be connected to the enclosure. As arranged, the voltage between the terminals and the enclosure on both sides of the current limiting elements/tank can be reduced, for example, to half the total voltage drop across the current limiting elements. In this case, the reference (voltage) for each module is the middle point of the matrix for a particular tank, different from previous approaches wherein all modules are floated based on the line voltage.

Approaches herein advantageously enable the FCL system to be scaled for higher voltages, as the voltage breakdown (kV/mm) does not change linearly with the clearance, and the voltage breakdown (kV/mm) is significantly lower for larger gaps. An advantage of this approach is the stipulation for voltage isolation is reduced by up to a factor of 2 and, therefore, the final size of the enclosure can be reduced.

Referring now to FIG. 1, an example FCL system 100 (e.g., a superconductor fault current limiter system) will be described in greater detail. As shown, the FCL system 100 may include one or more current limiting modules 114, 116 arranged together as a superconductor, or a superconducting matrix (hereinafter "matrix") 106. The matrix 106 may be disposed within a chamber 108 of an enclosure 107 (e.g., a cryostat tank). In some embodiments, the enclosure 107 may be an electrically conductive metallic tank, e.g., including multiple layers and a thermally and/or electrically insulating medium interposed therebetween the layers. In other embodiments, the enclosure 107 may be a thermally and/or electrically insulating tank such as those made with fiberglass or other dielectric material. In example embodiments, the superconducting matrix 106 may be maintained at a first voltage greater than zero voltage, and the enclosure 107 may be maintained at a second voltage greater than zero voltage, wherein the second voltage is different from the first voltage. For example, the first voltage may be less than the second voltage.

As shown, a plurality of insulating supports 110 are coupled to the enclosure 107, wherein the insulating supports 110 are positioned between the enclosure 107 and ground 112. In cases where the enclosure 107 is not connected to ground 112, the arrangement is referred to as a floating tank configuration. The insulating supports 110 may be used to insulate various voltages from one another. For example, the insulating supports 110 are used to isolate the enclosure 107, and the components contained therein, from ground 112.

Within the matrix 106, each of the current limiting modules 114, 116 may be a resistive fault current limiter, an inductive fault current limiter, a superconductor fault current limiter, or a solid state fault current limiter. The FCL system 100 may also include one or more electrical bushings 120 and 122, wherein a distal end of each electrical bushing 120, 122 may be coupled to respective current lines 124, 126 via terminals 130, 132. The electrical bushings 120, 122 may surround respective terminals 130, 132, wherein the electrical bushings 120, 122 extend through an upper wall 145 of the enclosure 107. The terminals 130, 132 may be disposed on opposite ends of a shunt reactor 136, for example as shown. In some embodiments, the current lines 124, 126 may be transmission lines used to transmit power from one location to another (e.g. current source to current end users), or power or current distribution lines. Collectively, the current lines 124, 126, and the shunt reactor 136 form a first electrical path 140. The set of terminals 130, 132 and the matrix 106 are connected along a second electrical path 141. In some embodiments, a generator is used to create a voltage 'V', referenced to the voltage of the enclosure 107. This voltage is used to power various components of the FCL system 100.

As can be seen, the FCL system 100 forms two parallel electrical paths 140, 141 branching between respective current lines 124, 126. Accordingly, the matrix 106 and the shunt reactor 136 are arranged in an electrically parallel fashion in the FCL system 100 along the respective electrical paths 140, 141. In some embodiments, the current limiting modules 114, 116 of the superconductor matrix 106 are connected along the second electrical path 141. Under normal operating conditions, the FCL system 100 is configured to draw approximately one hundred percent of load current through the matrix 106 and approximately zero percent of load current through the shunt reactor 136. Yet when a fault condition or event occurs, the shunt reactor 136 is configured to draw a majority of the load current, thus limiting the current passing through the matrix 106.

In some approaches, an inner conductive material (not shown) in the bushings 120, 122 may connect the terminals 130, 132 to the current limiting modules 114, and 116 of the matrix 106 via respective terminal connections 133, 135. Meanwhile, an outer insulator (not shown) may be used to insulate the enclosure 107 from the inner conductive material, thus allowing the enclosure 107 and the terminals 130, 132 and/or the superconducting matrix 106 to be at different electrical potentials. If desired, the matrix 106 may include an optional internal shunt reactor to connect the conductive material contained in the electrical bushings 120, 122.

The temperature of one or more of the current limiting modules 114, 116 may be maintained at a desired temperature range by a coolant 142 contained within the chamber 108 of the enclosure 107. To maintain a low temperature range within the enclosure 107, liquid nitrogen or another cryogenic gas may be used as the coolant 142. Although not shown, the coolant 142 may be cooled using an electrical cooling system.

As further shown, the FCL system 100 may include an electrical connection 144 directly electrically connected to the enclosure 107. As shown, the electrical connection 144 is connected at one end to the upper wall 145 of the enclosure 107, and at a second end to the matrix 106, e.g., between the current limiting modules 114, 116. In some embodiments, the electrical connection 144 is coupled between the current limiting modules 114, 116 to cause current limiting module 114 to be connected in series with current limiting module 116. As will be described in greater detail below, the electrical connection 144 permits a first voltage across the matrix 106 to be less than a second voltage across the terminals 130, 132.

Figure 2:
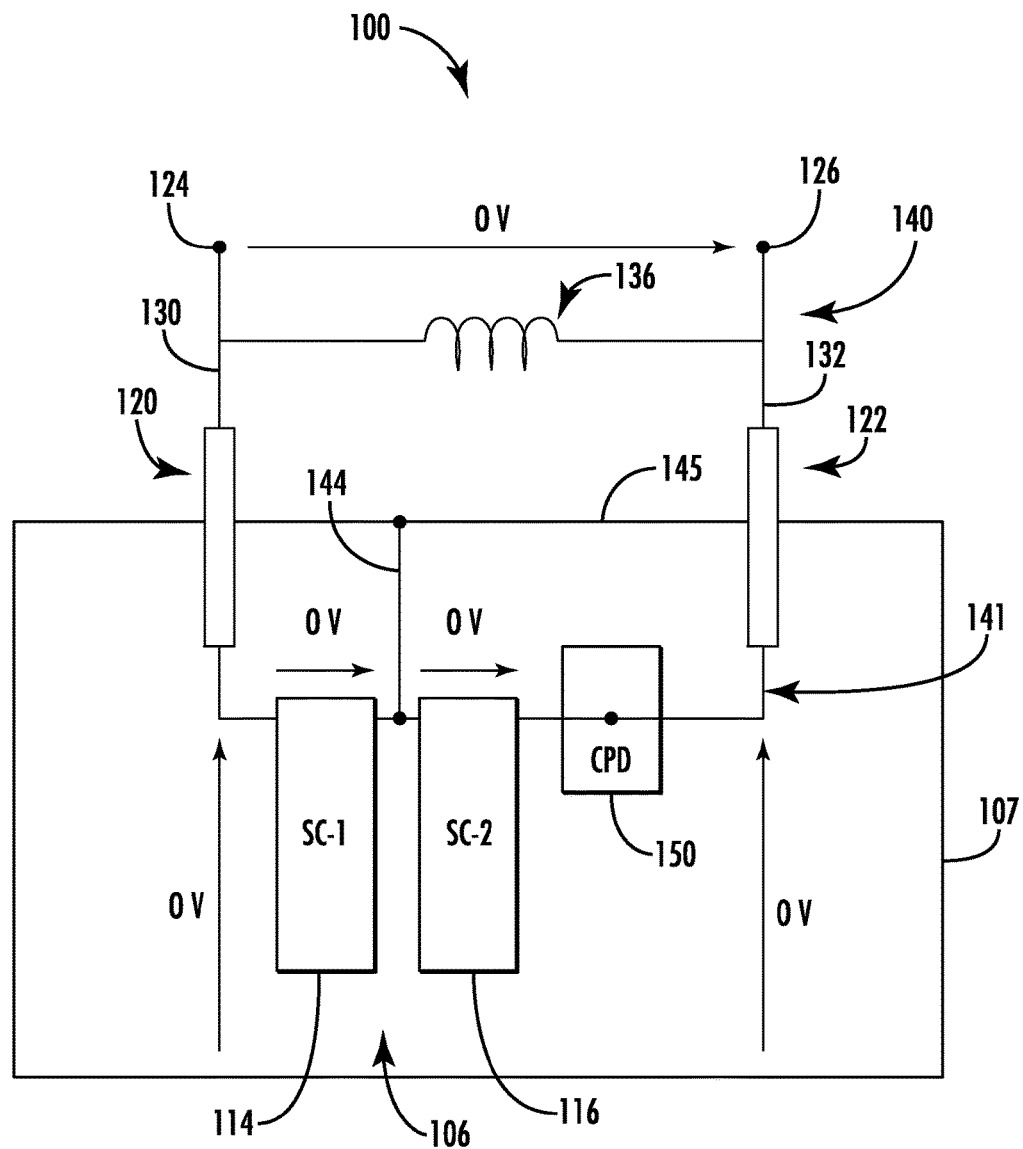
FIG. 2 depicts a schematic view of the FCL system of FIG. 1 during a superconducting condition according to embodiments of the disclosure.

Turning now to FIGS. 2-5, operation of the FCL system 100 will be described in greater detail. During use, the FCL system 100 may provide fault current protection by limiting load current passing between the current lines 124, 126. Under normal operation mode, a load current may periodically, occasionally, or always pass through the FCL system 100. For example, as shown in FIG. 2, the load current in normal operation mode exhibits a current level so the superconductor elements remain in a superconducting state and therefore transmit the load current through current limiting modules 114, 116 (e.g., superconductor modules) with zero resistance when the load current passes through the matrix 106. As shown, voltage along the first and second electrical paths 140 and 141 is zero, or approximately zero. Furthermore, during the superconducting condition depicted in FIG. 2, a current protection device (CPD) 150, such as a switch mechanism including a set of contacts, is in a closed or connected position. The CPD 150 may be disposed within the enclosure 107, or externally. In some embodiments, the CPD 150 is connected in series with matrix 106, e.g., current limiting module 116.

Figure 3:
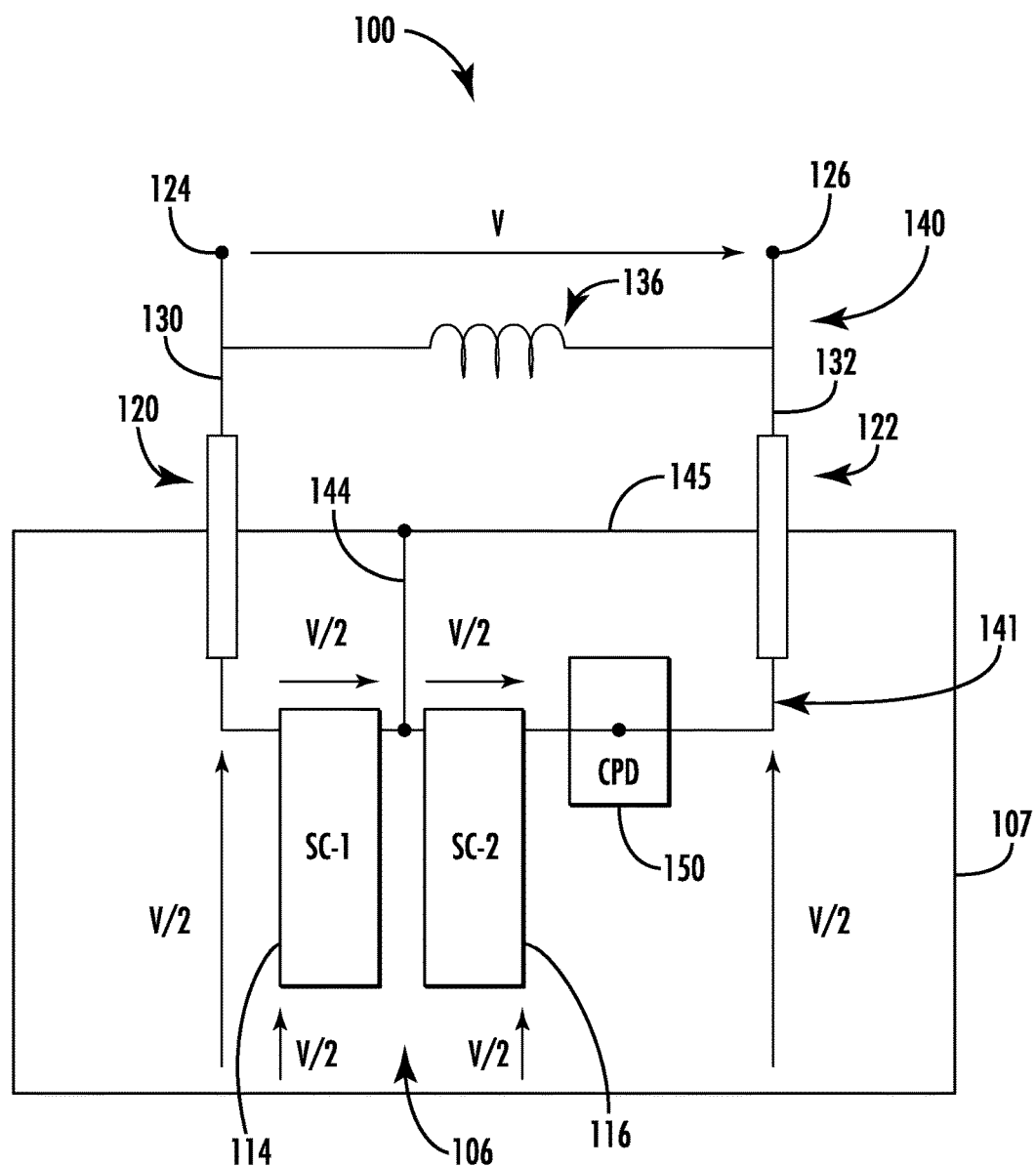
FIG. 3 depicts a schematic view of the FCL system of FIG. 1 during a fault condition according to embodiments of the disclosure.

As demonstrated in FIG. 3, during a fault current condition the FCL system 100 transitions between the superconducting condition to a non-superconducting mode (i.e., complete quench) while the CPD 150 may remain closed. As shown, voltage is divided by a number of independent modules (e.g., current limiting modules 114, 116) stacking up to make the total voltage drop over the matrix 106. In some embodiments, the matrix 106 may be maintained at the first voltage (e.g., V/2) greater than zero voltage, and the enclosure 107 may be maintained at the second voltage (e.g., V) greater than zero voltage. As shown, the second voltage V is greater than the first voltage V/2. In this embodiment, the first voltage (i.e., reference voltage) for each current limiting module 114, 116 is the middle point of the matrix 106 for the enclosure 107. As such, each of the current limiting modules 114, 116 is configured to receive, during a fault condition, a sub-portion (i.e., V/2) of the total voltage along the second electrical path 141. By providing the electrical connection 144 between the current limiting modules 114, 116, the stipulation for voltage isolation is reduced by up to a factor of 2. The voltage between the terminals 130, 132 to the enclosure 107 (on both sides) may therefore be reduced to half the total voltage drop across the matrix 106.

Figure 4:
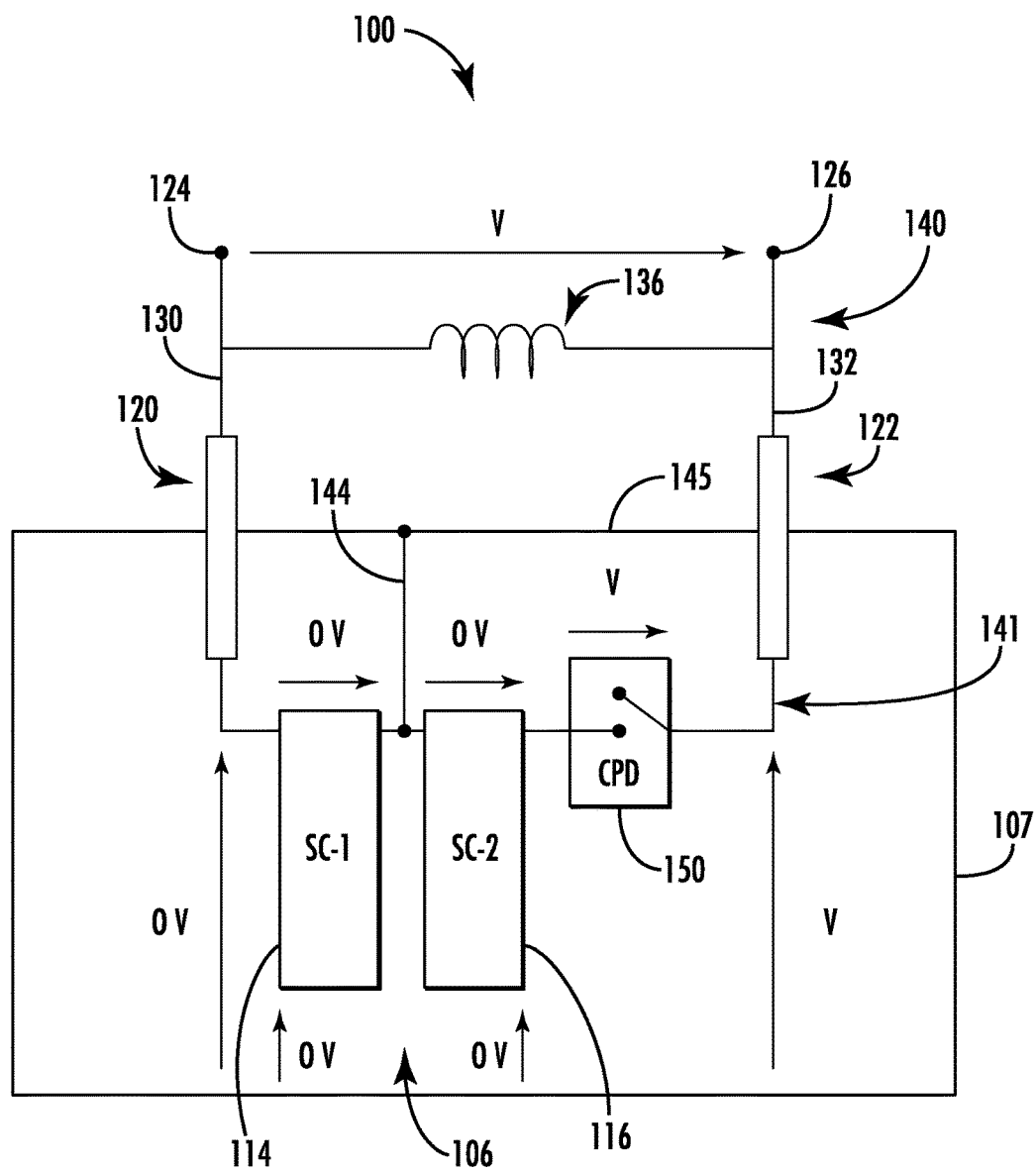
FIG. 4 depicts a schematic view of the FCL system of FIG. 1 during a fault condition when a current protection device is opened according to embodiments of the disclosure.

As demonstrated in FIG. 4, the CPD 150 may then be opened, causing voltage across the current limiting modules 114, 116 to go to zero, and the voltage to be delivered across the shunt reactor 136 along the first electrical path 140. As further shown, voltage is seen across the CPD 150, as well as along the terminal 132. In the condition demonstrated, the FCL system 100 is recovered to normal. The CPD 150 may then be subsequently closed, returning the FCL system 100 to the state depicted in FIG. 2.

Figure 5:
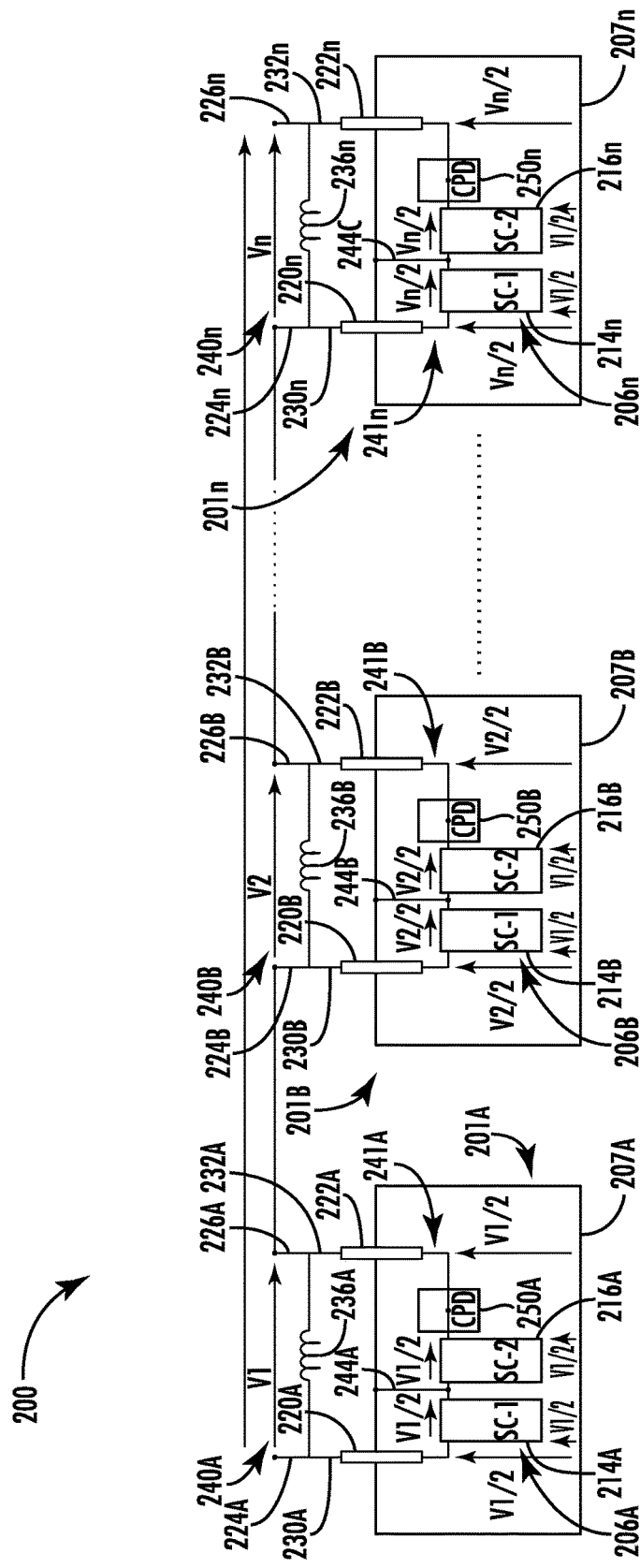
FIG. 5 depicts a schematic view of an example FCL system during a superconducting condition according to embodiments of the disclosure.

Turning now to FIG. 5, a FCL system 200 according to embodiments of the disclosure will be described in greater detail. In this embodiment, a plurality of modular fault current limiters 201A-n are combined to provide a symmetrical shielding approach. Specifically, the FCL system 200 may include multiple current limiting modules 214A-n and 216A-n arranged collectively as respective matrices 206A-n within each enclosure 207A-n. In some embodiments, the plurality of modular fault current limiters 201A-n may be stacked vertically to decrease an overall footprint. As shown, the FCL system 200 includes many or all of the features previously described in relation to the FCL system 100 of FIGS. 1-4. As such, just certain aspects of the FCL system 200 will hereinafter be described for the sake of brevity.

In this embodiment, modular fault current limiter 201A includes one or more electrical bushings 220A and 222A coupled to respective current lines 224A, 226A via terminals 230A, 232A. The terminals 230A, 232A may be disposed on opposite ends of the shunt reactor 236A, for example as shown. Collectively, the set of terminals 230A, 232A, the current lines 224A, 226A, and the shunt reactor 236A form a first electrical path 240A. The first electrical path 240A is connected with first electrical path 240B of adjacent modular fault current limiter 201B, wherein first electrical path 240B includes a second set of terminals 230B, 232B in communication with a second shunt reactor 236B. As shown, the second shunt reactor 236B is electrically connected in series with the shunt reactor 236A. A second plurality of current limiting modules 214B, 216B within the second enclosure 207B are connected in electrical communication with the second set of terminals 230B, 232B. As further shown, the modular fault current limiter 201B includes a second electrical connection 244B directly electrically connected to the second enclosure 207B, the second electrical connection 244B further connected to matrix 206B, e.g., between the second plurality of current limiting modules 214B, 216B. The modular fault current limiter 201n includes many or all of the same features of modular fault current limiters 201A-B and, as such, will not be described in detail for the sake of brevity.

As shown, the plurality of modular fault current limiters 201A-n may be combined in series to provide a symmetrical shielding approach. In some embodiments, each modular fault current limiter 201A-n is a floating fault current limiter, wherein the total voltage V is divided by a number 'n' of modular fault current limiters. For example, in the embodiment shown, modular fault current limiters 201A-B receive, respectively, voltages V1 and V2. As further shown, voltages V1 and V2 may be divided by a number of independent modules (e.g., current limiting modules 214A-B, 216A-B) stacking up to make the total voltage drop over each respective matrix 206A-B. In this embodiment, the reference voltage for each current limiting module 214A-B, 216A-B is the middle point of each matrix 206A-B. As such, each of the current limiting modules 214A-B, 216A-B is configured to receive, during a fault condition, an equal or unequal sub-portion (e.g., V1/2 and V2/2) of the total voltage V. The voltage between the terminals 230A-n, 232A-n to each enclosure 207A-n (on both sides) may therefore be reduced to half the total voltage drop across each respective matrix 206A-n.

Figure 6:
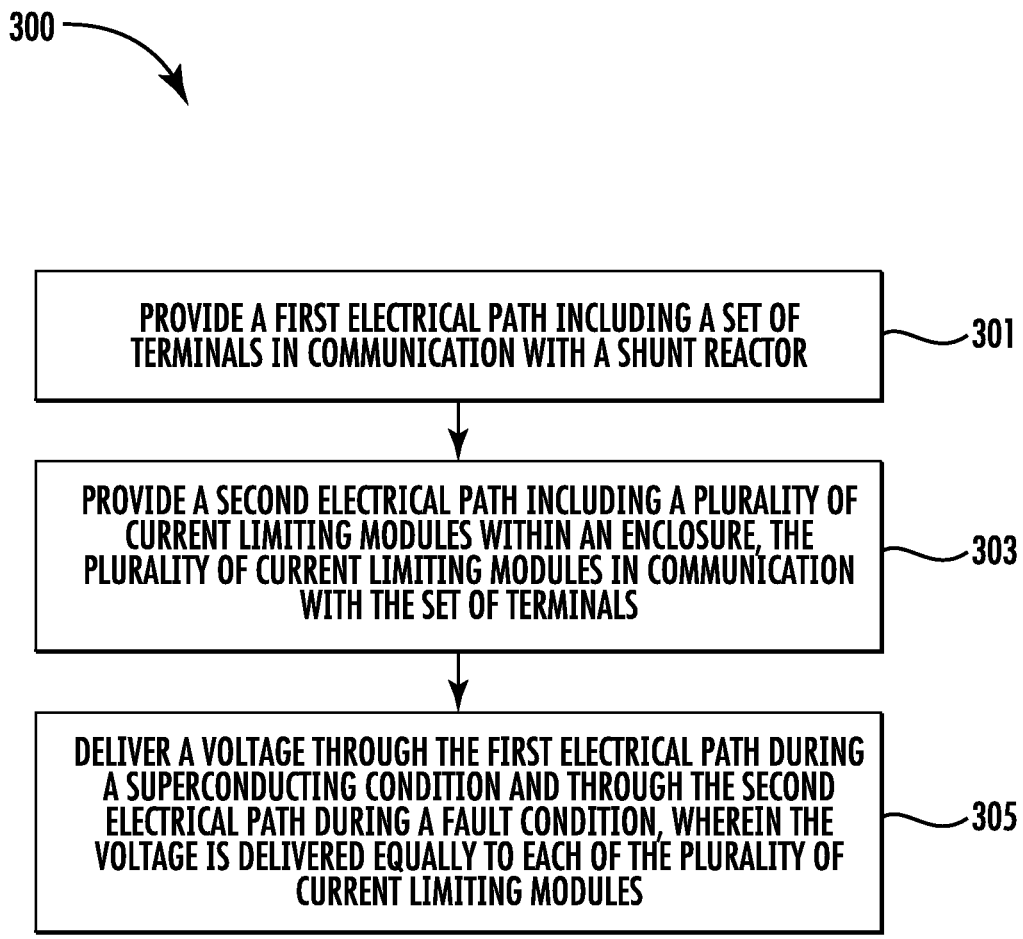
FIG. 6 depicts is a flowchart illustrating an example method for providing symmetrical electrostatic shielding in a fault current limiter system according to embodiments of the present disclosure.

Turning now to FIG. 6, depicted is a flow diagram of a process 300 for providing symmetrical electrostatic shielding in a fault current limiter system in accordance with certain aspects of the present disclosure. As shown, the process 300 may include providing a first electrical path including a set of terminals in communication with a shunt reactor, as shown at block 301. The process 300 may further include providing a second electrical path including a plurality of current limiting modules within an enclosure, the plurality of current limiting modules in communication with the set of terminals, as shown at block 303.

The process 300 may further include delivering a voltage through the first electrical path during a superconducting condition and delivering the voltage through the second electrical path during a fault condition, wherein an electrical connection directly electrically connected to the enclosure causes the voltage to be delivered equally (or unequally) to each of the plurality of current limiting modules, as shown at block 305. In some embodiments, the process 300 further includes connecting a CPD to the plurality of current limiting modules, wherein the CPD is closed during the superconducting condition and opened during the fault condition. In some embodiments, the CPD is directly electrically connected in series with one of the plurality of current limiting modules. In some embodiments, the process 300 further includes electrically connecting the electrical connection to an interior surface of the enclosure.

Figure 7:
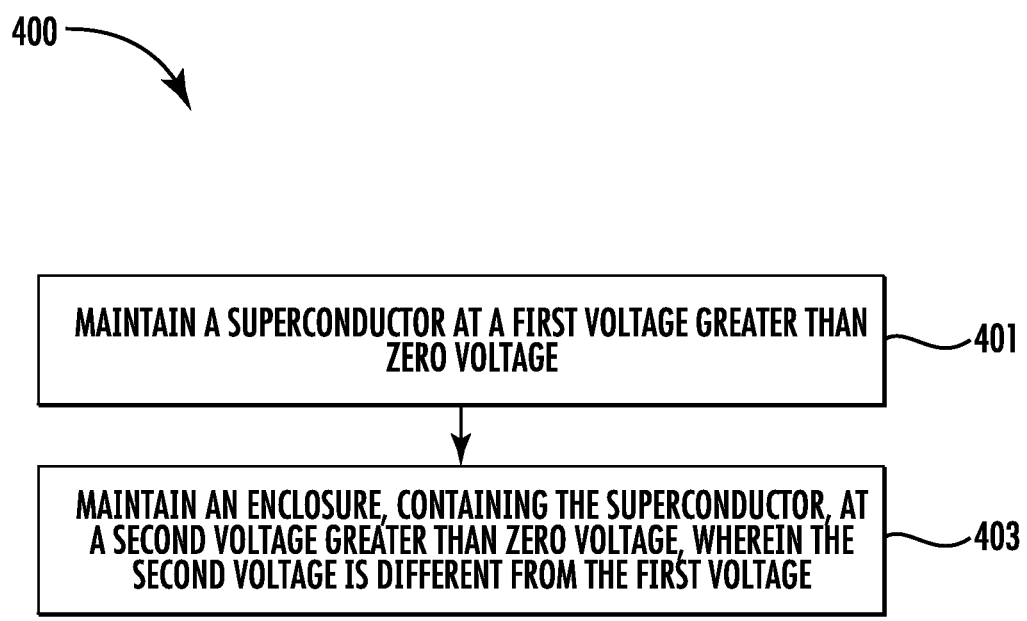
FIG. 7 depicts is a flowchart illustrating an example method for providing symmetrical electrostatic shielding in a fault current limiter system according to embodiments of the present disclosure.

Turning now to FIG. 7, depicted is a flow diagram of a process 400 for providing symmetrical electrostatic shielding in a fault current limiter system in accordance with certain aspects of the present disclosure. As shown, the process 400 may include maintaining a superconductor at a first voltage greater than zero voltage, as shown at block 401. The process 400 may further include maintaining an enclosure at a second voltage greater than zero voltage, wherein the second voltage is different from the first voltage, and wherein the enclosure contains the superconductor, as shown at block 403. In some embodiments, the second voltage is greater than the first voltage.

In summation, various embodiments herein describing FCL systems provide a first advantage including reduction of a voltage isolation by up to a factor of 2. As a result, the final size of the FCL system, and in particular the enclosure, may be reduced significantly. A second advantage of the embodiments of the disclosure includes optimizing physical clearances between the matrix and the cryostat wall in a geometrically symmetric design as a result of the electrical connection being directly electrically connected to the cryostat. The voltage between the matrix terminals to the cryostat walls (e.g., on both sides) can be reduced to half the total voltage drop across the matrix. Reduction in voltage is advantageous to scale-up the FCL system for higher voltages, since the voltage breakdown (kV/mm) does not change linearly with the clearance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A fault current limiter system comprising:
   a superconductor matrix within an enclosure, the superconductor matrix electrically connected to a set of terminals; and
   an electrical connection electrically connected between the superconductor matrix and the enclosure, wherein the electrical connection permits a voltage across the superconductor matrix with respect to the enclosure to be less than a total voltage across the set of terminals.

2. The fault current limiter system of claim 1, further comprising a current protection device electrically connected in series with the superconductor matrix.

3. The fault current limiter system of claim 1, further comprising a shunt reactor connected between the set of terminals, the shunt reactor further connected in parallel with the superconductor matrix.

4. The fault current limiter system of claim 3, further comprising a first electrical path electrically parallel to a second electrical path, wherein the shunt reactor is connected along the first electrical path, and wherein the set of terminals and the superconductor matrix are connected along the second electrical path.

5. The fault current limiter system of claim 3, further comprising:
   a second set of terminals in communication with a second shunt reactor, wherein the second shunt reactor is electrically connected in series with the shunt reactor;
   a second superconductor matrix within a second enclosure, the second superconductor matrix in communication with the second set of terminals; and a second electrical connection directly electrically connected between the second superconductor matrix and the second enclosure.

6. The fault current limiter system of claim 1, wherein the enclosure is a cryostat.

7. The fault current limiter system of claim 1, wherein the superconductor matrix includes a plurality of current limiting modules.

8. The fault current limiter system of claim 7, wherein each of the plurality of current limiting modules receives a sub-portion of the voltage across the superconductor matrix.

9. The fault current limiter system of claim 7, wherein the plurality of current limiting modules include at least one of: a resistive fault current limiter, an inductive fault current limiter, a superconductor fault current limiter, or a solid state fault current limiter.

10. The fault current limiter system of claim 1, further comprising an electrical bushing surrounding each of the set of terminals, wherein each electrical bushing extends through the enclosure.

11. The fault current limiter system of claim 1, wherein the superconductor matrix includes a first superconductor connected in parallel with a second superconductor.

12. A fault current limiter, comprising:
a superconductor maintained at a first voltage greater than zero voltage; and
an enclosure containing the superconductor, the enclosure maintained at a second voltage greater than zero voltage, wherein the second voltage is different from the first voltage;
wherein the superconductor is a superconductor matrix electrically connected to a set of terminals, and wherein the superconductor matrix is coupled to the enclosure by an electrical connection.

13. The fault current limiter of claim 12, wherein the first voltage is less than the second voltage.

14. The fault current limiter of claim 12, further comprising a current protection device electrically connected in series with the superconductor matrix.

15. The fault current limiter of claim 12, further comprising a shunt reactor connected between the set of terminals, the shunt reactor further connected in parallel with the superconductor matrix.

16. A method of providing symmetrical electrostatic shielding in a fault current limiter, the method comprising:
maintaining a superconductor at a first voltage greater than zero voltage;
maintaining an enclosure at a second voltage greater than zero voltage, wherein the second voltage is different from the first voltage, and wherein the enclosure contains the superconductor;
electrically connecting the superconductor to a set of terminals; and
electrically connecting the superconductor to the enclosure via an electrical connection, wherein the electrical connection permits the first voltage across the superconductor to be less than the second voltage across the set of terminals.

17. The method of claim 16, further comprising connecting a shunt reactor between the set of terminals, the shunt reactor further connected in parallel with the superconductor.

18. The method of claim 16, further comprising connecting a current protection device to the superconductor, wherein the current protection device is closed during a superconducting condition and opened during a fault condition.

* * * * *